(12) United States Patent
Graf

(10) Patent No.: US 7,361,974 B2
(45) Date of Patent: Apr. 22, 2008

(54) MANUFACTURING METHOD FOR AN INTEGRATED SEMICONDUCTOR STRUCTURE

(75) Inventor: Werner Graf, Dresden (DE)

(73) Assignee: Infineon Technologies AG, Munich (DE)

( * ) Notice: Subject to any disclaimer, the term of this patent is extended or adjusted under 35 U.S.C. 154(b) by 75 days.

(21) Appl. No.: 11/388,234

(22) Filed: Mar. 23, 2006

(65) Prior Publication Data

US 2007/0224810 A1    Sep. 27, 2007

(51) Int. Cl.
*H01L 21/4763* (2006.01)

(52) U.S. Cl. ............... 257/637; 438/690; 438/692; 438/691; 257/E21.645; 257/E21.646; 257/E21.649

(58) Field of Classification Search ............... 438/690, 438/692, 691, 637, 622, 618, 584, 589; 257/E21.645, 257/E21.646, E21.647, E21.649, E21.653, 257/E21.656

See application file for complete search history.

(56) References Cited

U.S. PATENT DOCUMENTS

| | | | |
|---|---|---|---|
| 5,723,381 A * | 3/1998 | Grewal et al. | 438/633 |
| 6,821,872 B1 * | 11/2004 | Liao et al. | 438/586 |
| 2005/0003308 A1 * | 1/2005 | Frohlich et al. | 430/313 |
| 2006/0148227 A1 * | 7/2006 | Kronke et al. | 438/586 |

* cited by examiner

Primary Examiner—W. David Coleman
Assistant Examiner—Su C. Kim
(74) Attorney, Agent, or Firm—Jenkins, Wilson, Taylor & Hunt, P.A.

(57) ABSTRACT

The present invention provides a manufacturing method for an integrated semiconductor structure comprising the steps of: providing a semiconductor substrate having a plurality of gate stacks in a first region and at least one gate stack in a second region; forming a sacrificial plug made of a first material surrounded by an isolation layer between two adjacent gate stacks in the first region; depositing a planarisation layer over said plurality of gate stacks in said first region and said at least one gate stack in said second region; backpolishing said planarisation layer such that the upper surface of said sacrificial plug is exposed; forming a structured hardmask layer made of said first material on said backpolished planarisation layer which structured hardmask layer adjoins said sacrificial plug and has at least one opening in said second region; forming at least one contact hole in said second region under said at least one opening in said second region, said at least one contact hole exposing a substrate contact area adjacent to said gate stack in said second region or a contact area in said gate stack; selectively removing said hardmask layer and said sacrificial plug in a single etch step, whereby another contact hole is formed between two adjacent gate stacks in said first region; removing said isolation layer on the bottom of said another contact hole such that the substrate is exposed; and filling said contact hole and said another contact hole with a respective contact plug.

16 Claims, 20 Drawing Sheets

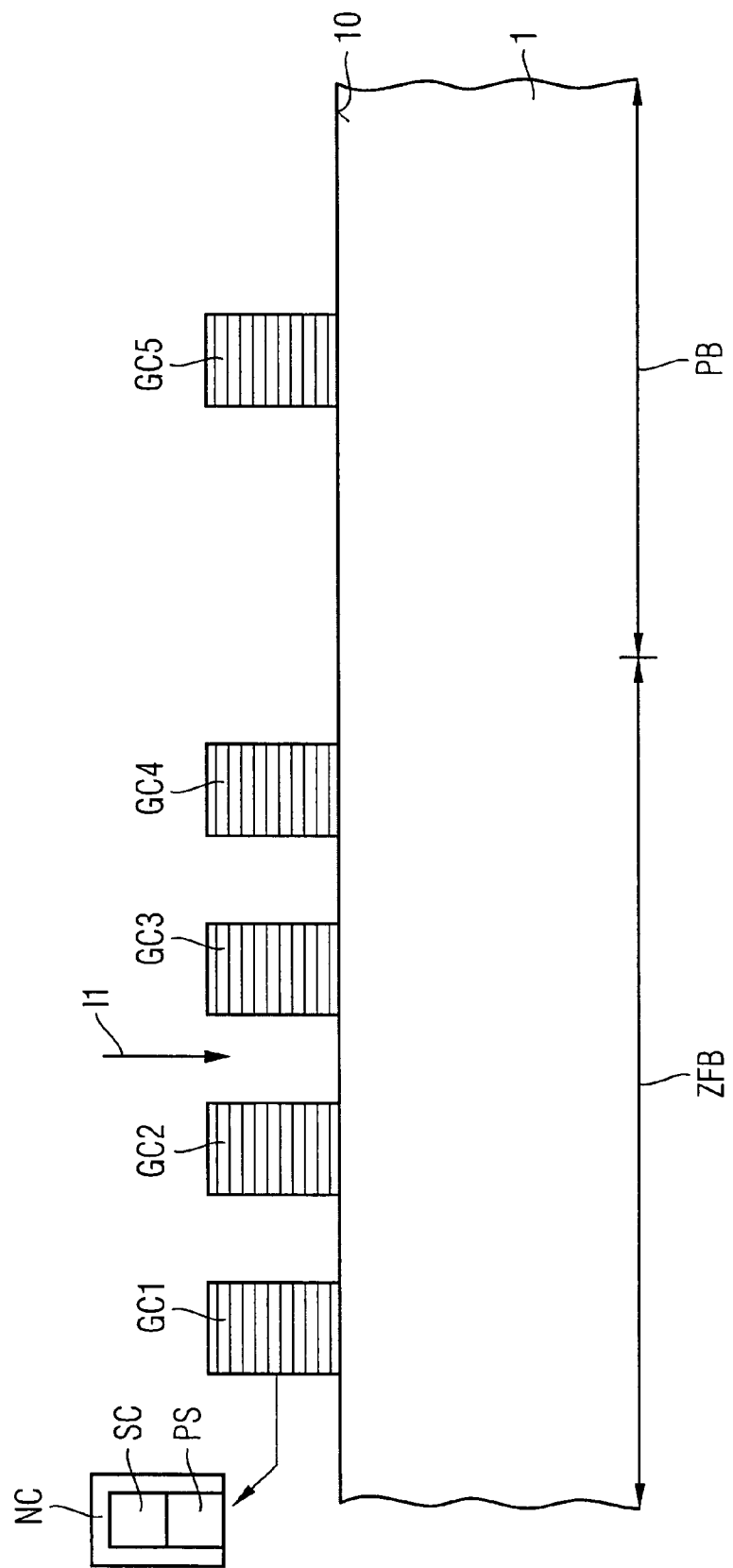

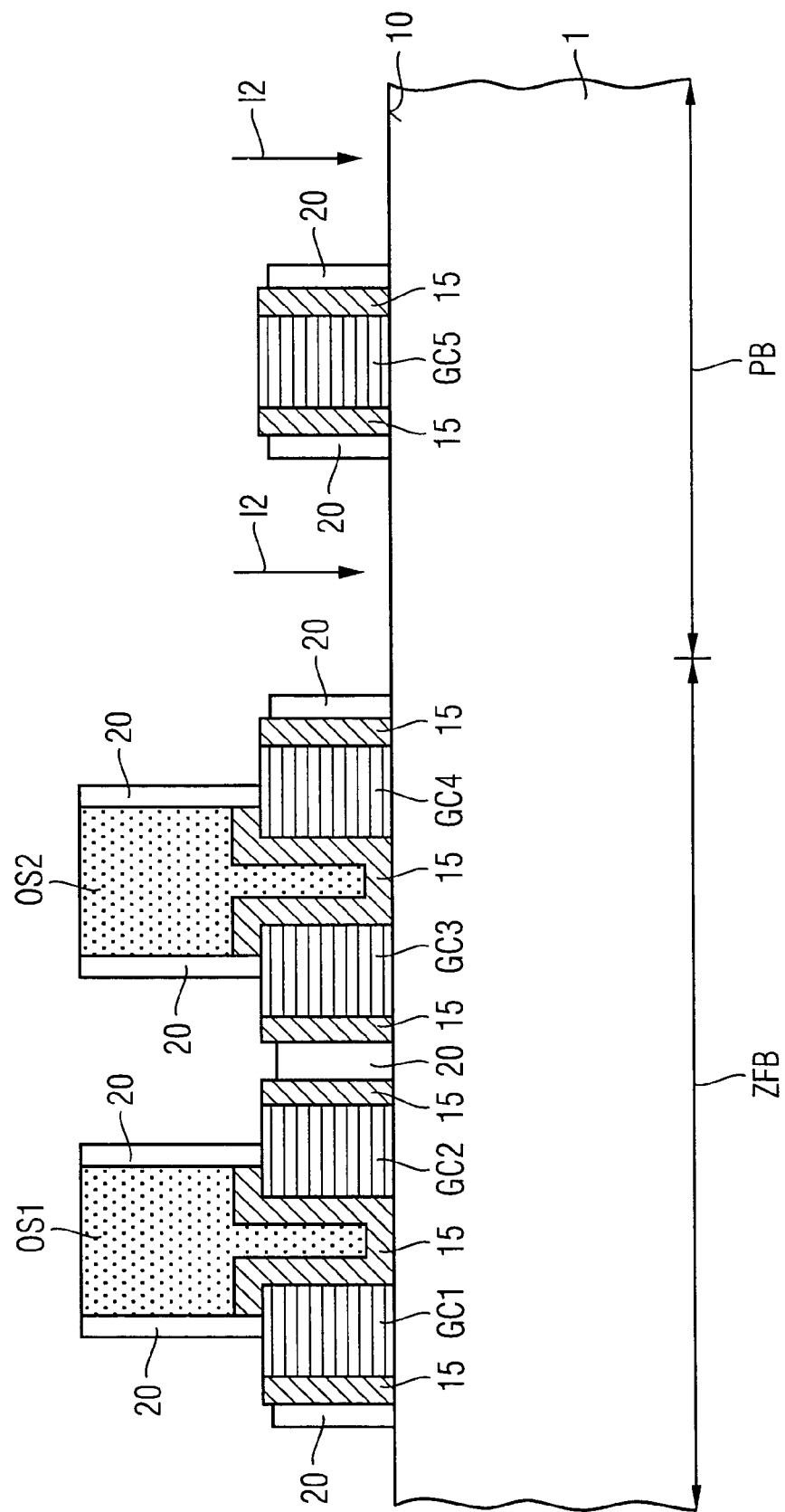

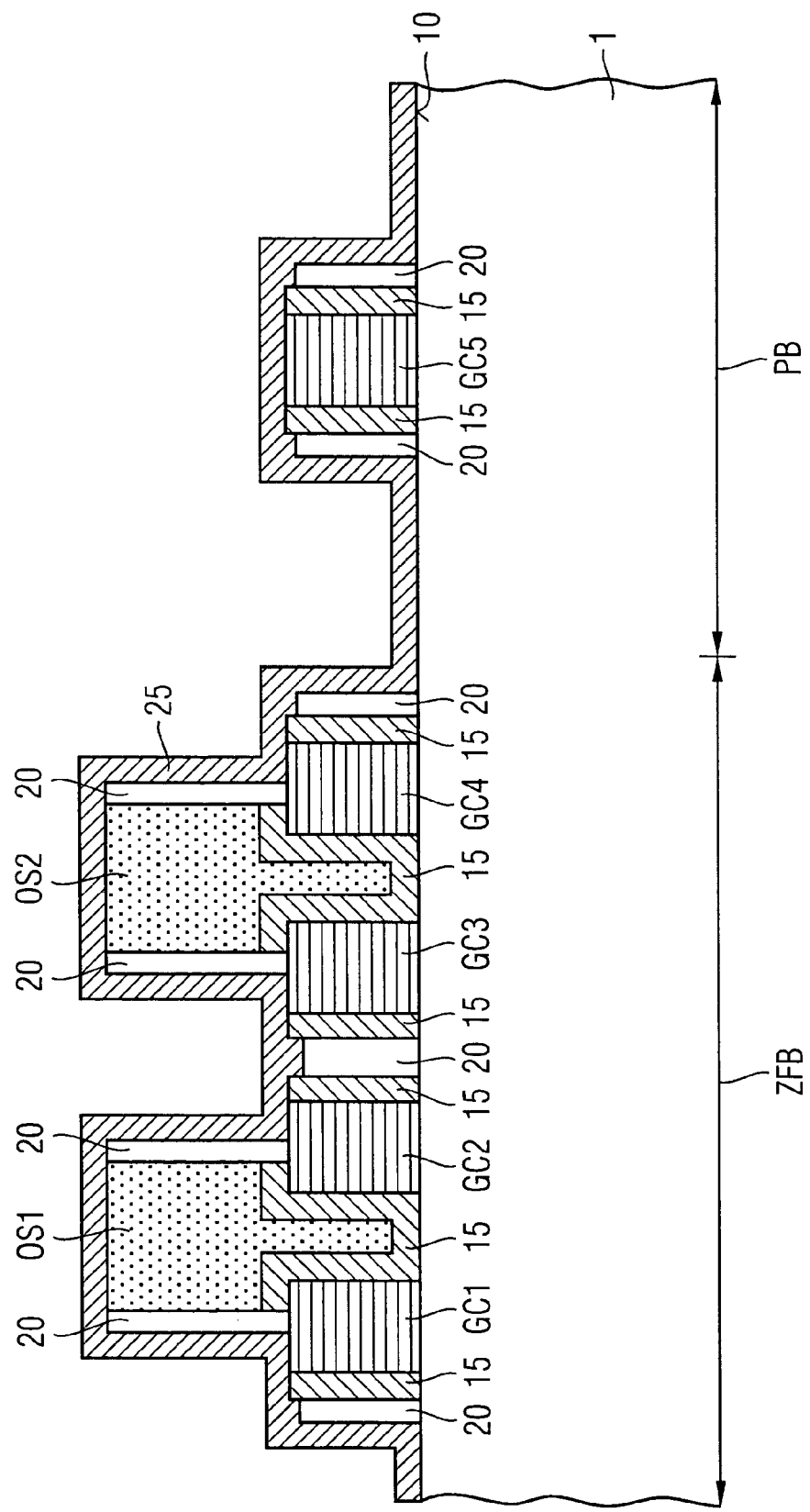

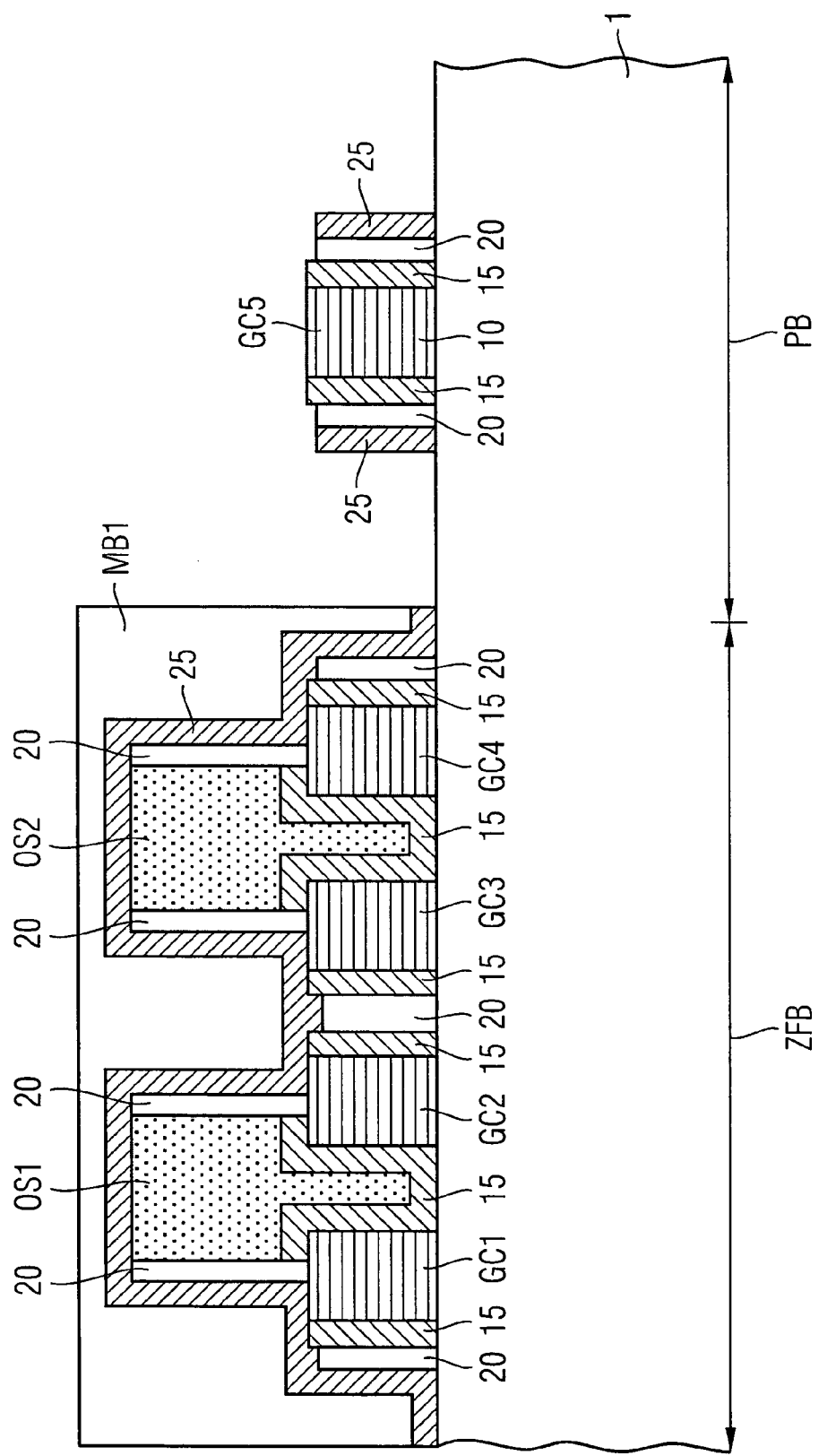

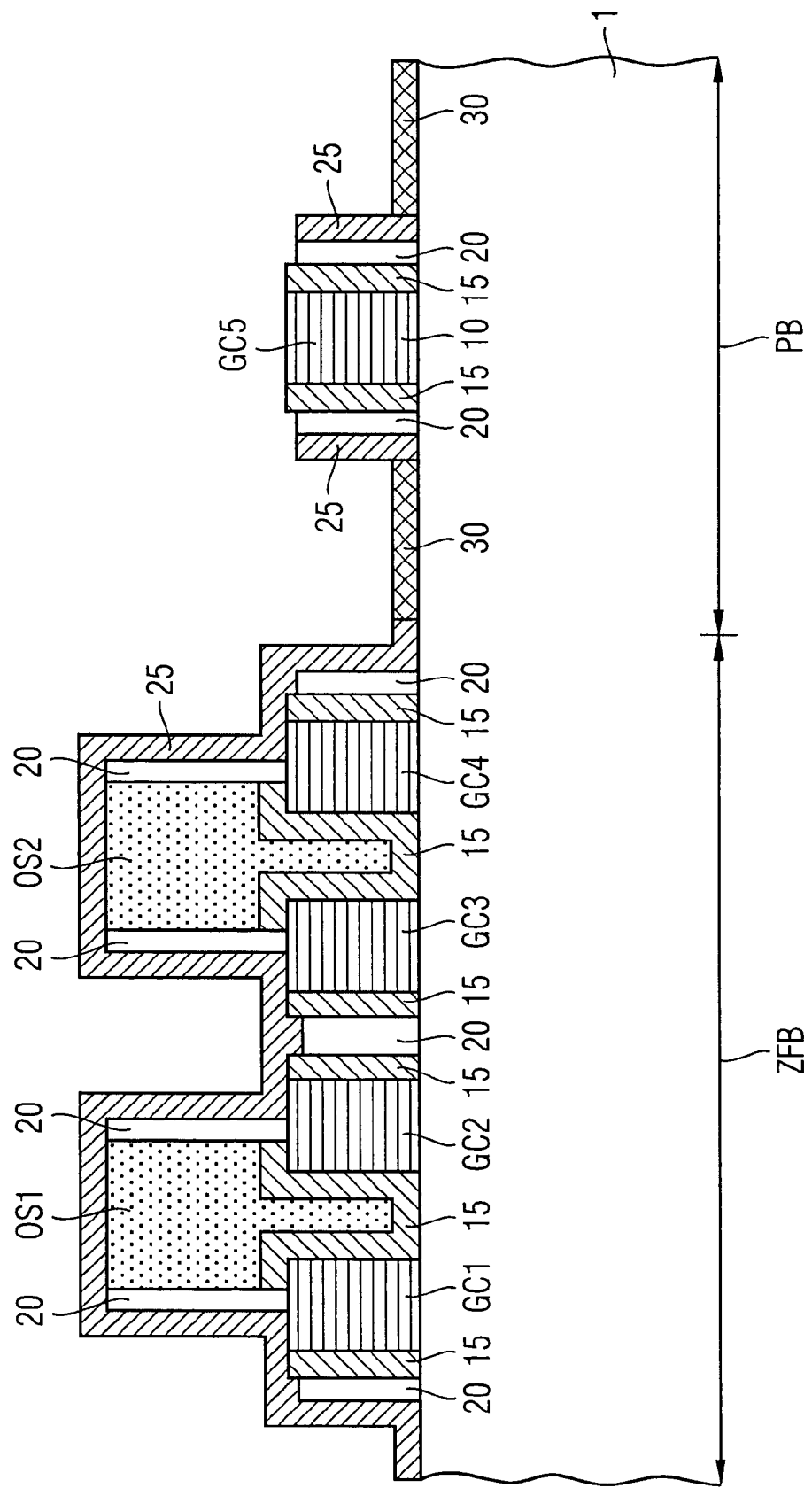

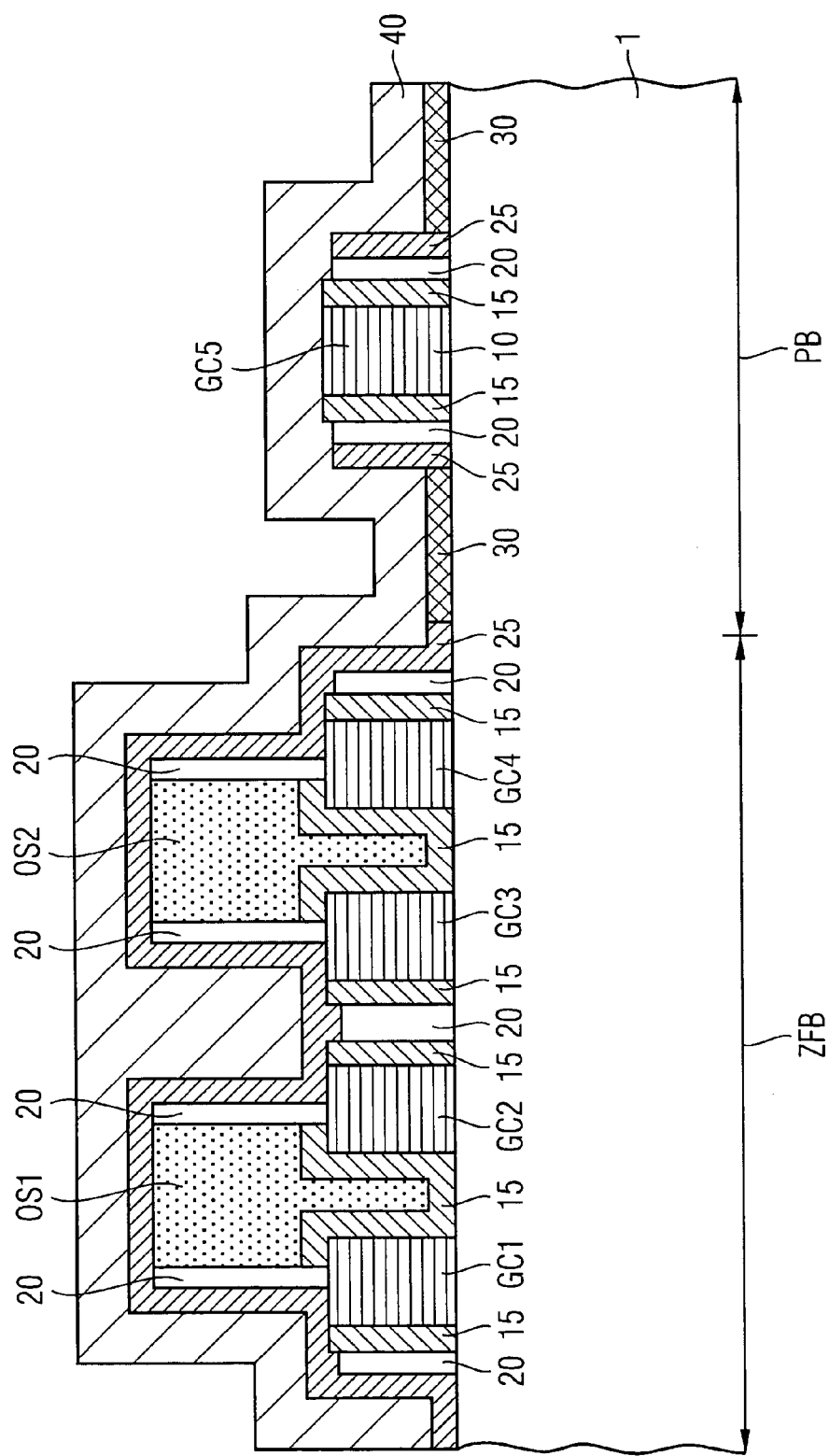

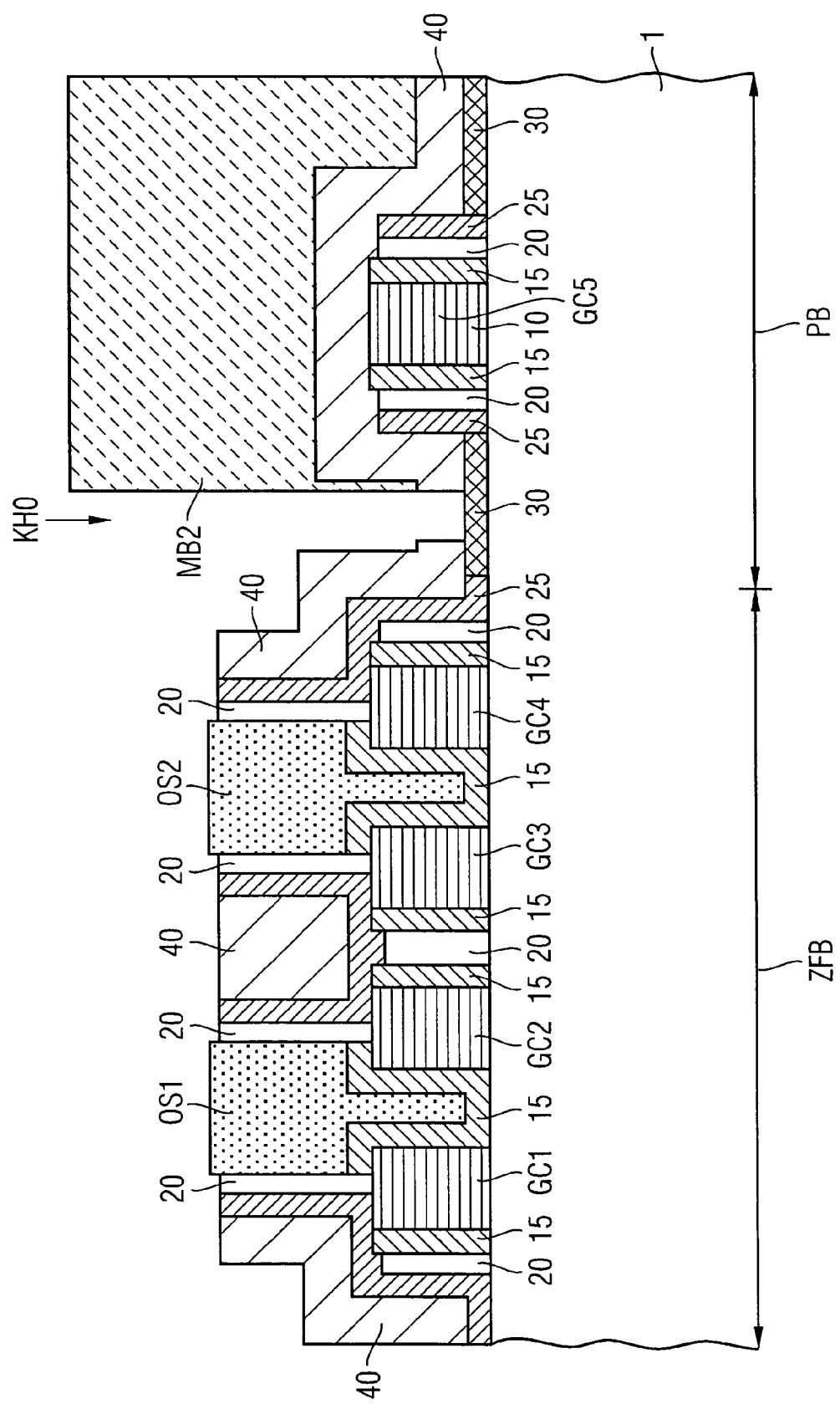

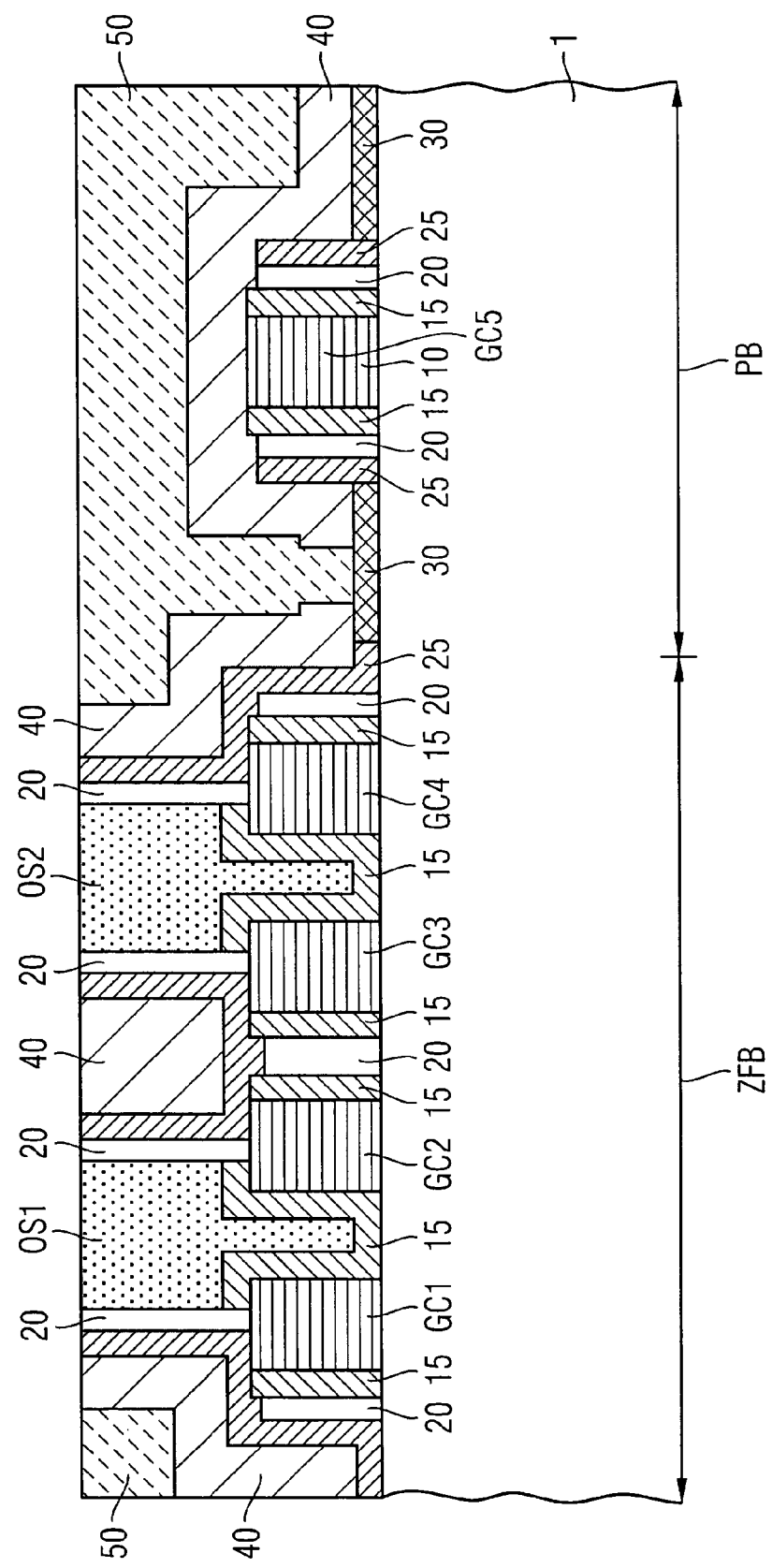

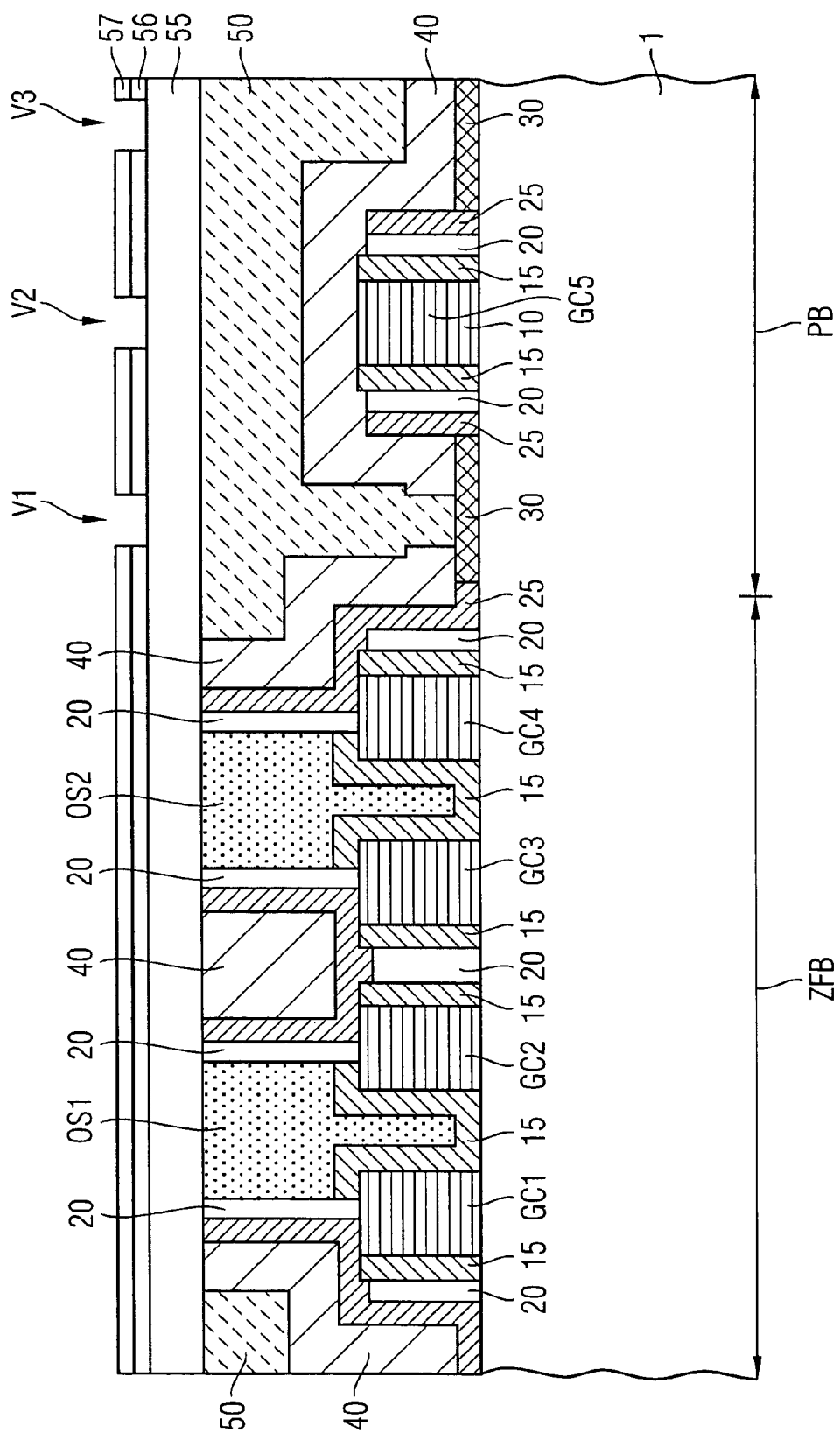

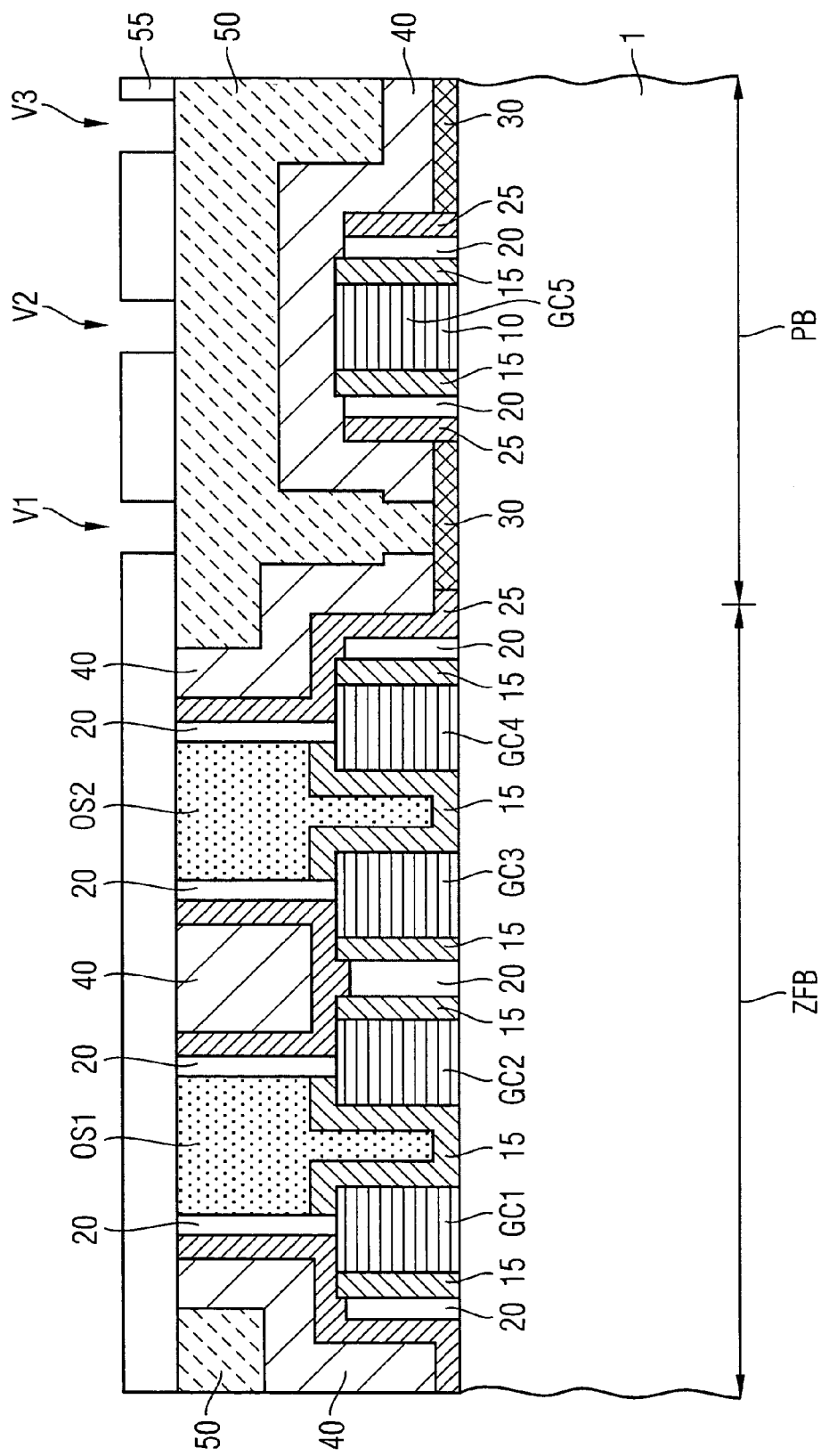

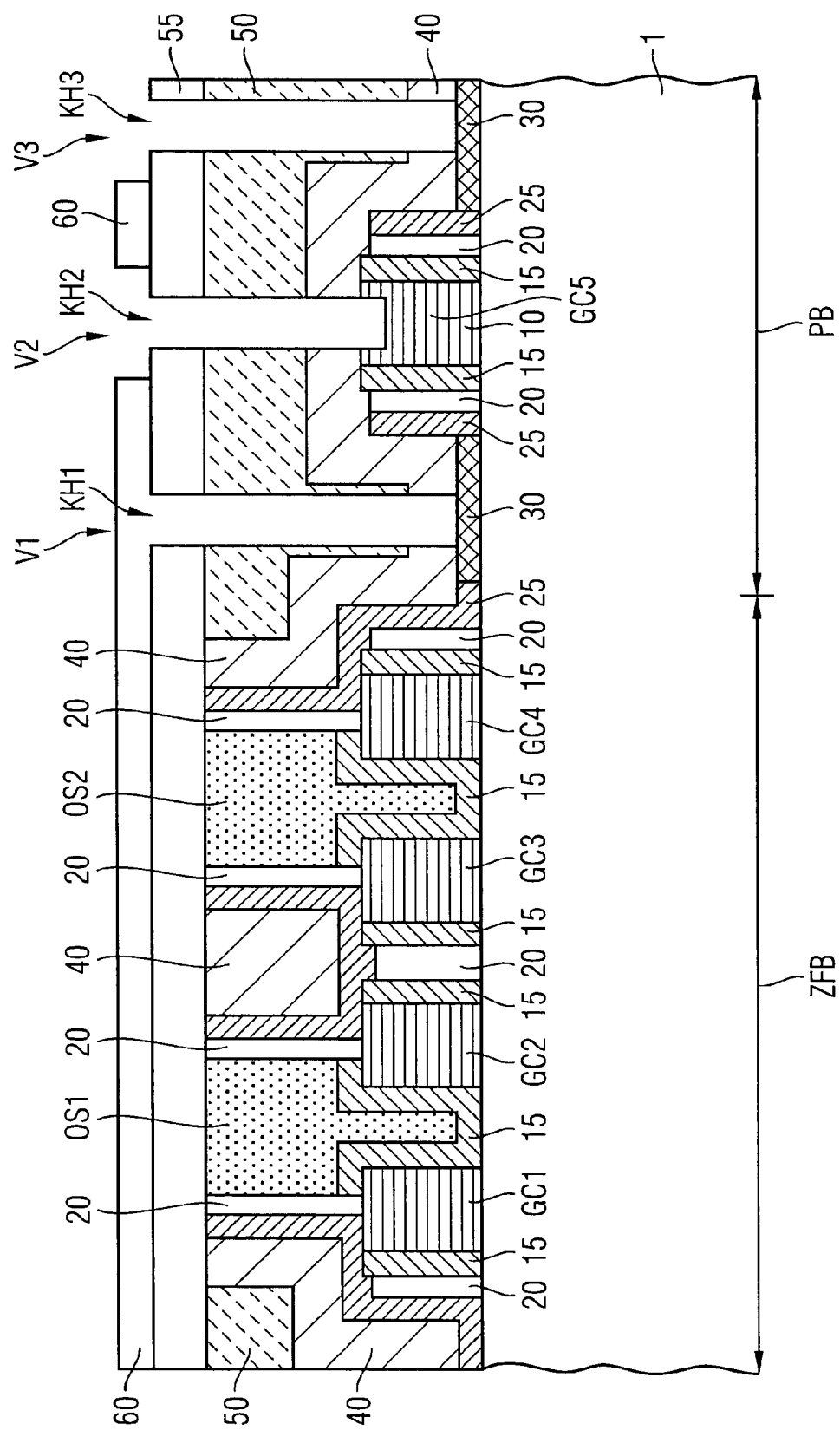

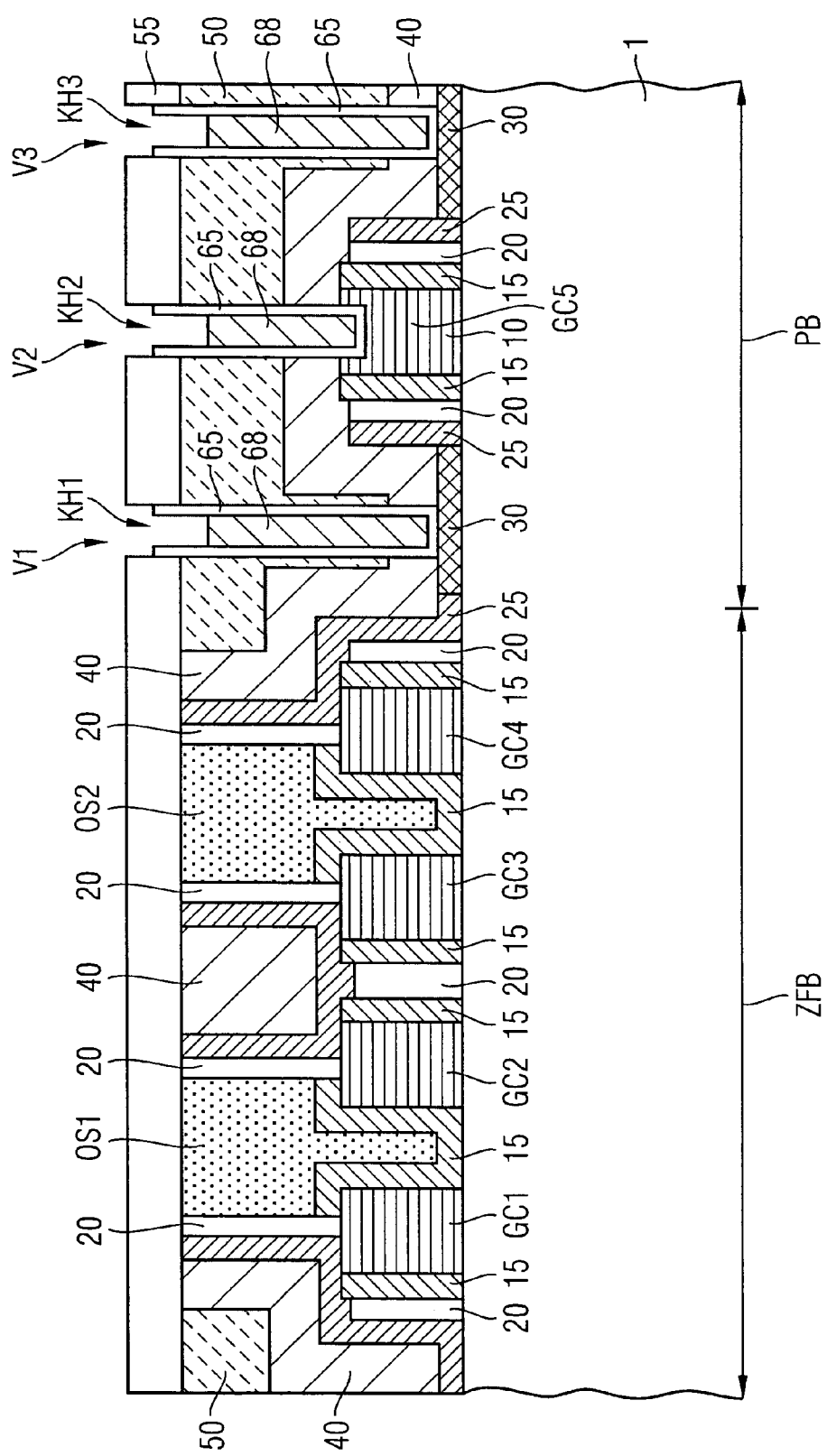

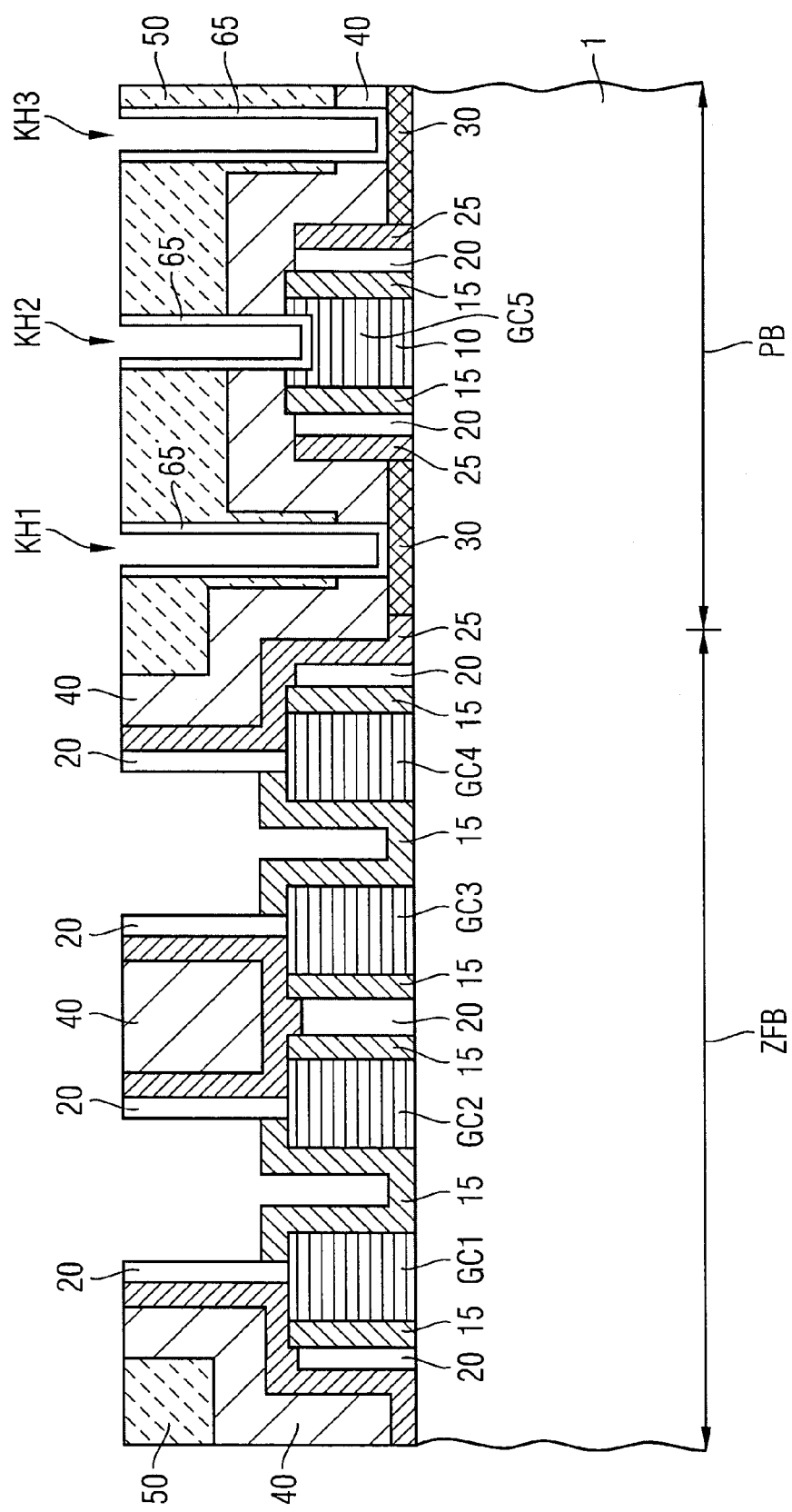

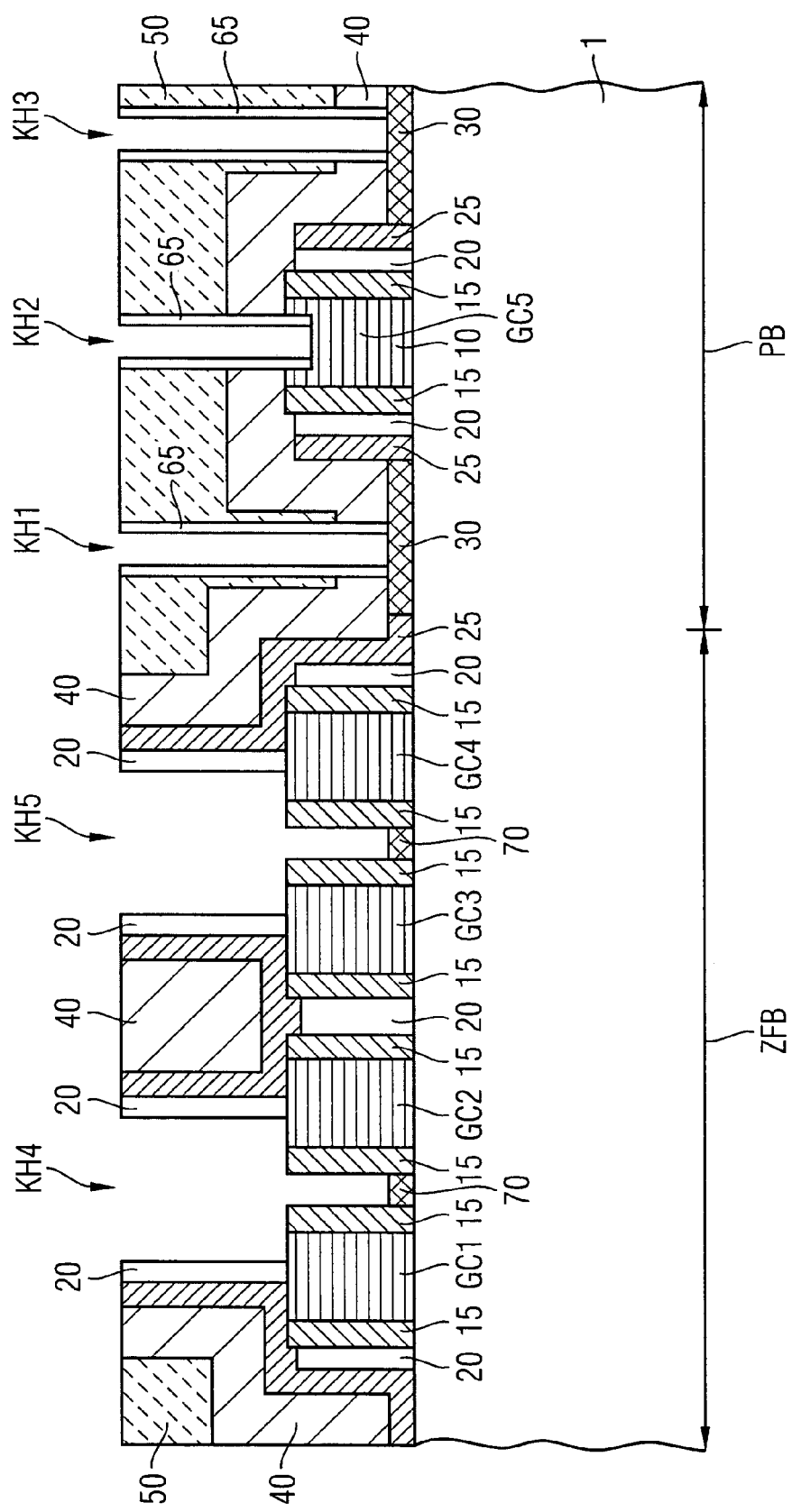

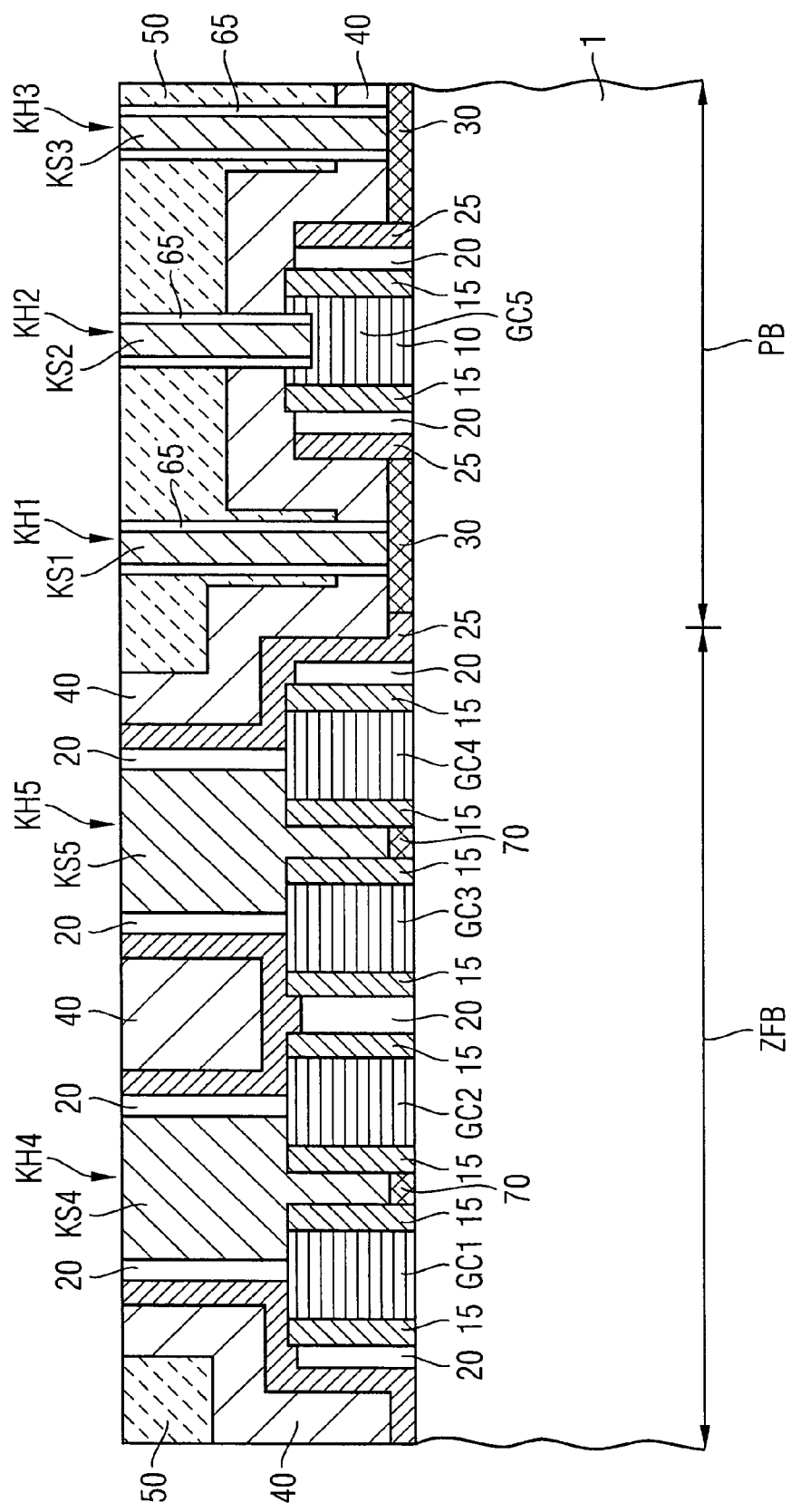

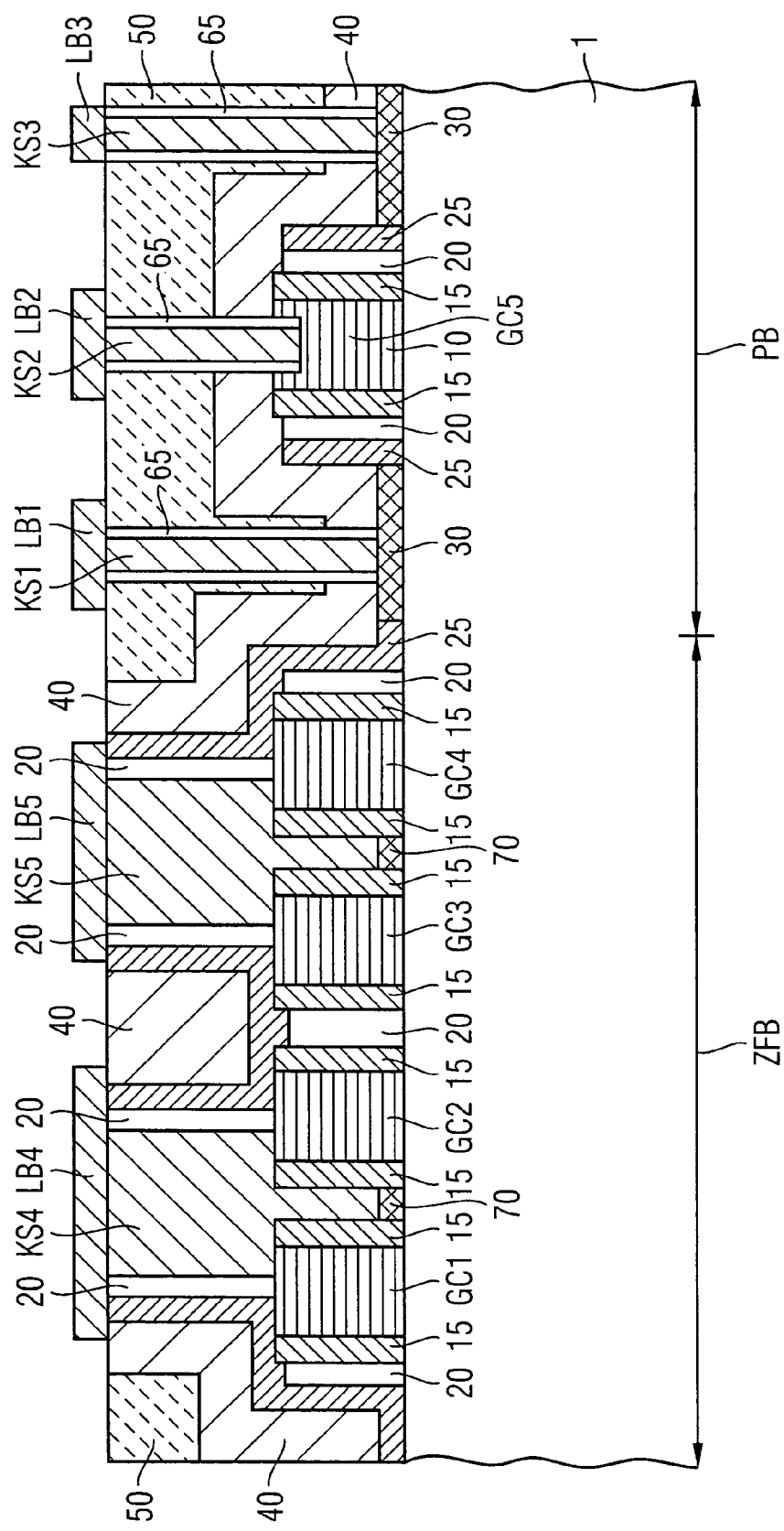

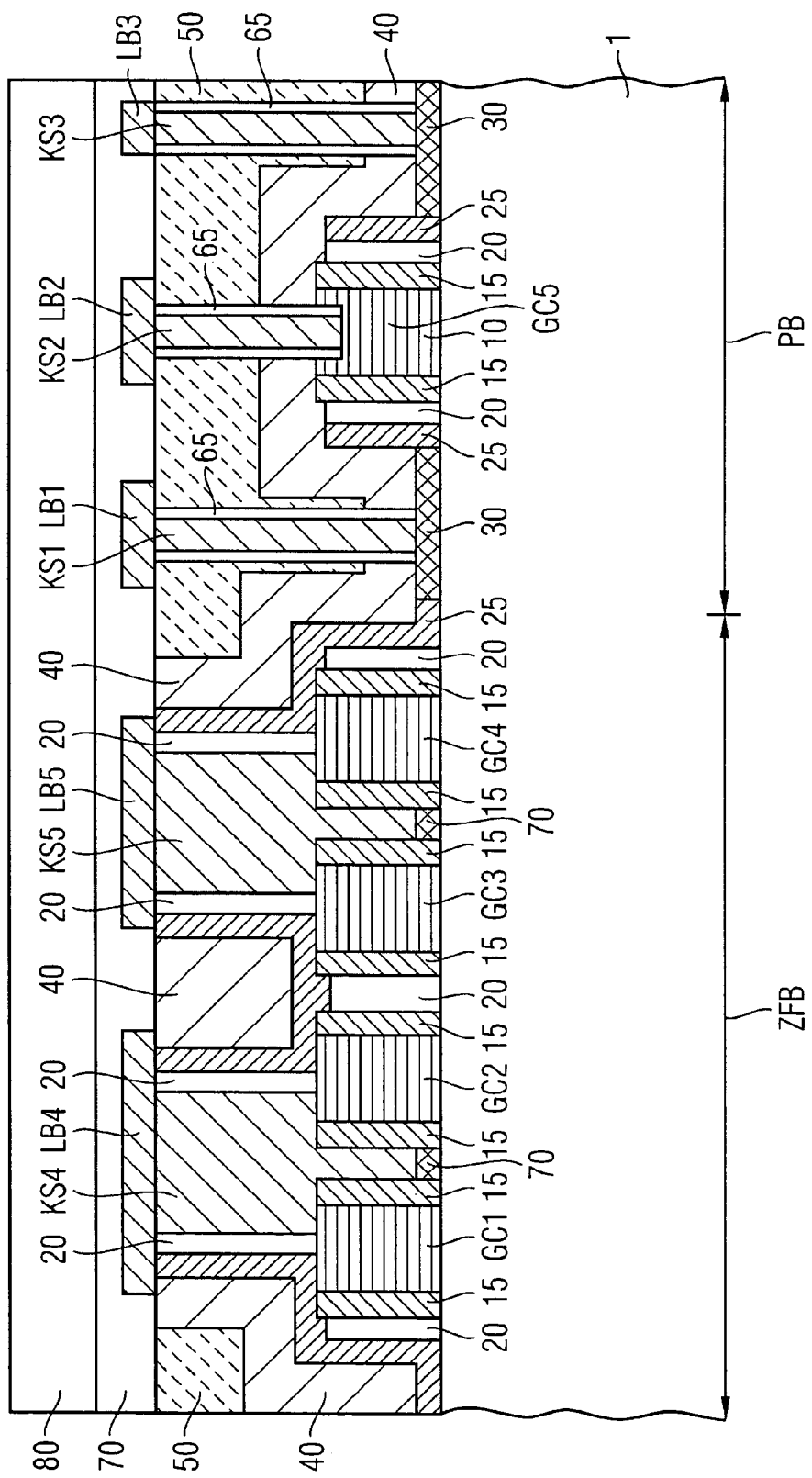

MANUFACTURING METHOD FOR AN INTEGRATED SEMICONDUCTOR STRUCTURE

BACKGROUND OF THE INVENTION

1. Field of the Invention

The present invention relates to a manufacturing method for an integrated semiconductor structure.

2. Description of the Related Art

Although in principle applicable to arbitrary integrated semiconductor structures, the following invention and the underlying problems will be explained with respect to integrated DRAM memory circuits in silicon technology.

US 2005100033308 A1 discloses a method for fabricating a contact hole plane in a memory module with an arrangement of memory cells each having a selection transistor on a semiconductor substrate with an arrangement of mutually adjacent gate electrode stacks on the semiconductor surface. An insulator layer is formed on the semiconductor surface and a sacrificial layer is subsequently formed on the insulator layer, then material plugs are produced on the sacrificial layer for the purpose of defining contact openings between the mutually adjacent gate electrode stacks. Then the sacrificial layer is etched to form material plugs with the underlying sacrificial layer blocks, after the production of the vitreous layer with uncovering of the sacrificial layer blocks above the contact openings between the mutually adjacent gate electrode stacks, an essentially planar surface being formed. Then, the sacrificial layer material is etched out from the vitreous layer and the uncovered insulator material is then removed above the contact openings on the semiconductor surface. Finally, the contact opening regions are filled with a conductive material.

EP 0 766 301 A2 discloses a method of forming a self-aligned overlapping bit-line contact comprising the steps of depositing a sacrificial material on a film; patterning said material, said material being a sacrificial fill-in for a bit-line contact stud; depositing an oxide on said material; planarizing said oxide; and etching said material in said film to form a self-allient bit-line contact.

SUMMARY OF THE INVENTION

It is an object of the present invention to provide an improved manufacturing method for an integrated semiconductor structure where critical both contacts of a memory cell region and contacts of a peripheral device region may be easily implemented.

This object is achieved in accordance with the invention by means of a manufacturing method for an integrated semiconductor structure comprising the steps of providing a semiconductor substrate having a plurality of gate stacks in a first region and at least one gate stack in a second region; forming a sacrificial plug made of a first material surrounded by an isolation layer between two adjacent gate stacks in the first region; depositing a planarization layer over said plurality of gate stacks in said first region and said at least one gate stack in said second region; backpolishing said planarization layer such that the upper surface of said sacrificial plug is exposed; forming a structured hardmask layer made of said first material on said backpollished planarization layer which structured hardmask layer adjoins said sacrificial plug and has at least one opening in said second region; forming at least one contact hole in said second region under said at least one opening in said second region, said at least one contact hole exposing a substrate contact area adjacent to said gate stack in said second region or a contact area in said gate stack; selectively removing said hardmask layer and said sacrificial plug in a single etch step, whereby another contact hole is formed between two adjacent gate stacks in said first region; removing said isolation layer on the bottom of said another contact hole such that the substrate is exposed; and filling said contact hole and said another contact hole with a respective contact plug.

A particular advantage is that said hardmask layer and said sacrificial plug can be removed in a single etch step thus reducing process complexity.

Preferred embodiments are listed in the dependent claims.

According to a preferred embodiment before said step of selectively removing said hardmask layer and said sacrificial plug, a masked etch of said at least one contact hole is performed; a liner is formed in said at least one contact hole and on said hardmask layer; said at least one contact hole is filled with a sacrificial infill, said liner is removed from said hardmask layer to a level below the surface of the hardmask layer; and said sacrificial infill is removed.

According to another preferred embodiment before said step of depositing said planarization layer the following steps are performed: performing deposition of a liner; masking the first region; exposing the substrate adjacent to said at least one gate stack in said second region; and forming said contact area by forming a metal silicide region on said substrate.

According to another preferred embodiment after said step of forming said contact area before said step of depositing said planarization layer the following steps are performed: depositing a strain layer over said plurality of gate stacks in said first region and said at least one gate stack in said second region.

According to another preferred embodiment said strain layer is removed from said sacrificial plug and from at least a part of said contact area.

According to another preferred embodiment said first material is polysilicon or carbon.

According to another preferred embodiment the step of providing said contact area between said two adjacent gate stacks in said another contact hole comprises the steps of: exposing the substrate; and forming said contact area by forming another metal silicide region on said substrate.

According to another preferred embodiment the first region is a memory cell region and the second region is a peripheral device region.

According to another preferred embodiment said planarization layer is a spin-on glass layer.

According to another preferred embodiment said sacrificial plug is surrounded by an isolation layer by depositing and anisotropic etching a first, second and third isolating liner layer.

According to another preferred embodiment a metal layer is deposited over the contact holes and polished back by a chemical-mechanical polishing step in order to form contact plugs in contact holes.

According to another preferred embodiment a wiring layer is deposited over said contact plugs and lithographically structured in order to form wiring lines to electrically connect contact plugs.

According to another preferred embodiment a metal layer is deposited over said contact holes and lithographically structured in order to form contact plugs and wiring lines.

According to another preferred embodiment a layer of phosphor-silicate glass is deposited on top of the witting lines. This phosphor-silicate glass layer acts as a getter layer above the wiring layer.

According to another preferred embodiment a spin on dielectric is deposited between the wiring lines and the layer of phosphor-silicate-glass.

According to another preferred embodiment the metal layer is made of tungsten.

Figure 1B:
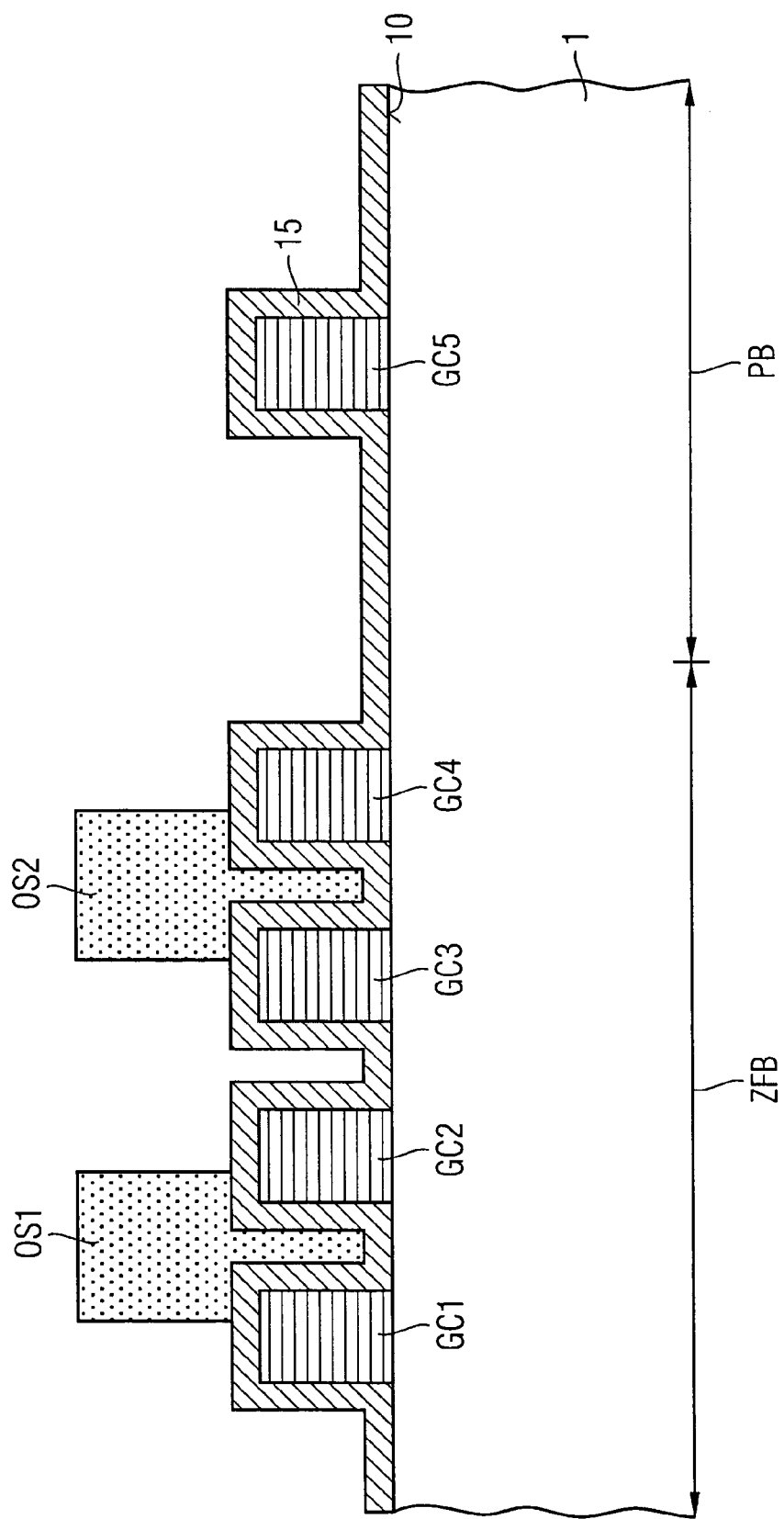
FIGS. 1A-T show schematic cross-sections of a manufacturing method for an integrated semiconductor structure according to an embodiment of the present invention.
Figure 1I:
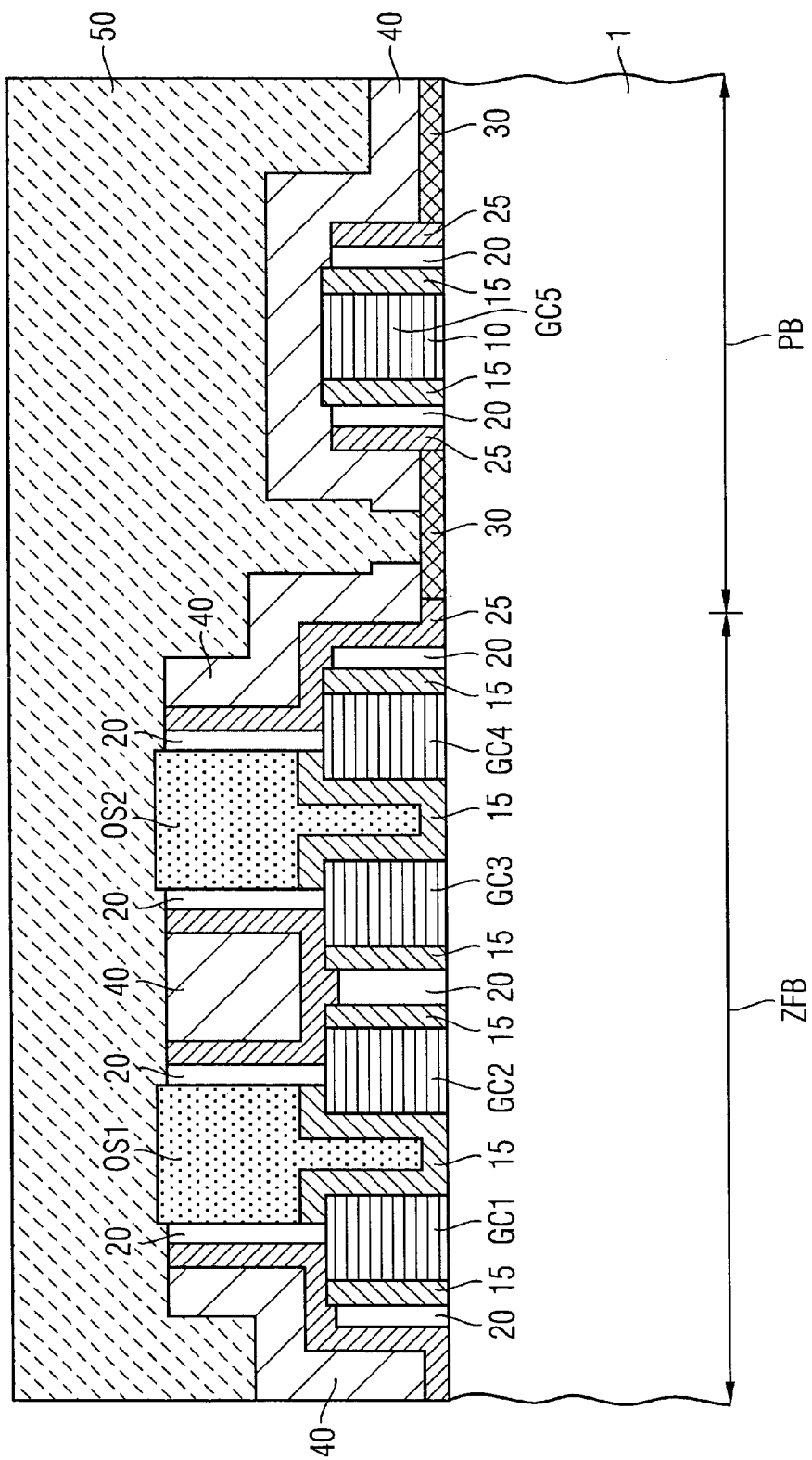

In the Figures, identical reference signs denote equivalent or functionally equivalent components.

DESCRIPTION OF THE PREFERRED EMBODIMENTS

FIGS. 1A-T show schematic cross-sections of a manufacturing method for an integrated semiconductor structure as an embodiment of the present invention.

In FIG. 1A, reference sign 1 denotes a silicon semiconductor substrate having a memory cell region ZFB and a peripheral device region PB. On the main surface of the substrate 1, a thin gate dielectric layer 10 is provided, for example a gate oxide layer. Moreover, a plurality of gate stacks GC1, GC2, GC3, G04, GC5 is formed on said gate dielectric layer 10. In this example, the gate stacks GC1-GC4 run in parallel lines along a direction which is perpendicular to the drawing plain of FIG. 1A. Gate stacks GC1-GC4 are located in the memory cell region ZFB, whereas gate stack GC5 is located in the peripheral device region PS.

All of the gate stacks GC1-GC5 include a polysilicon layer PS, an overlying silicide layer SC (for example tungsten silicide) and a nitride cap NC, as depicted on the explosive insert on the left hand of FIG. 1A.

In the process stage shown in FIG. 1A, a first implantation I1 is performed in order to introduce N-type Impurities into the P-type silicon semiconductor substrate 1 which form the active source/drain regions located adjacently between the gate stacks GC1-GC5 and which are not shown here for the sake of simplicity.

As depicted in FIG. 1B, an oxide liner layer 15 is deposited over the structure of FIG. 1A covering the gate stacks GC1-GC5 and the main surface of the semiconductor substrate 1 lying there between. Moreover, sacrificial polysilicon plugs OS1, OS2 are formed between gate stacks GC1, GC2 and between gate stacks GC3, G04, respectively. These sacrificial polysilicon plugs OS1, OS2 protrude into the space between the gate stacks GC1, GC2, GC3, GC4 and partly cover the upper surface of the gate stacks GC1, GC2 and GC3, GC4, respectively. For example, a process as disclosed in EP 0 766 301 A2 may be used to form the sacrificial polysilicon plugs OS1, OS2.

It should be mentioned here, that instead of forming an oxide liner layer 15, also a nitride liner layer 15 could be formed.

In a next process step which is shown in FIG. 1C, an anisotropic spacer etch is performed on the first oxide liner layer 15 leaving spacers of the oxide liner layer 15 on the sidewalls of gate stacks GC1-GC5 which are not massed by sacrificial polysilicon plugs OS1, OS2 and leaving a u-form region of the oxide liner layer 15 between gate stacks GC1, GC2 and GC3, GC4, respectively.

Alternatively, a blockmask could be used to completely mask the oxide liner layer 15 in the memory cell region ZFB.

Thereafter, a second ion implantation I2 is performed on the exposed surface of the semiconductor substrate 1 in the peripheral device region PB, for example using N-type dopants in order to control the device properties in the peripheral device region PB independently of the device properties in the memory cell region ZFB.

Thereafter, a second oxide liner layer 20 is deposited over the resulting structure and another inosotropic spacer etch is performed which forms second oxide liner layer spacers 20 on the first oxide liner layer spacers 15 at the sidewalls of the gate stacks GC1-GC5 and second oxide spacers 20 on the side walls of the sacrificial polysilicon plugs OS1-OS2.

Here, it should be mentioned that in the example shown the thickness of the first oxide liner layer spacers 15 amounts to approximately 20 nm, and the thickness of the second oxide liner layer spacers 20 amounts to approximately 15 nm.

With reference to FIG. 1D, a nitride liner layer 25 is deposited over the resulting structure. As illustrated in FIG. 1E, a photo resist block mask MB1 is formed over the memory cell region ZFB. Thereafter, an isotropic spacer etch is performed in order to remove the horizontal parts of the nitride liner layer 25 in the peripheral device region PB leaving nitride liner layer spacers 25 on gate stack GC5 over the second oxide liner layer spacers 20 and exposing the surface of the semiconductor substrate 1 after removal of the thin gate dielectric layer 10 where the surface is not masked by the gate stack GC5 and the attached spacers 15, 20, 25.

In the next process step which is illustrated in FIG. 1F, cobalt silicide regions 30 are formed on the exposed surface of the semiconductor substrate 1 in the peripheral device region PB adjacent to the gate stack GC5. The formation of the cobalt silicide region takes place according to a known method at a temperature of 750° C. and resulting in $CoSi_2$. It should be mentioned here that the cobalt silicide regions 30 could also be formed as a CoSi region at a lower temperature of approximately 550° C. The cobalt silicide regions 30 correspond to source/drain contact regions of gate stack GC5 and are intended to make effective electrical contact to (not shown) source/drain regions on both sides of the gate stack GC5.

In a subsequent process step which is shown in FIG. 1G, a nitride strain layer 40 is deposited over the structure of FIG. 1F. This nitride strain layer 40 is used for applying a desired stress over gate stack GC5 in the peripheral device region PB. The nitride strain layer 40 typically has a thickness of 30-50 nm.

As shown in FIG. 1H, a second photo resist block mask MB2 is formed over the gate stack GC5 and its periphery leaving a forming area for a contact hole KH0 in the peripheral device region PB over the cobalt silicide contact region 30 on the left hand of the gate stack GC5 uncovered.

Then, an anisotropic spacer etch is performed on the nitride strain layer 40 removing the horizontal parts thereof which are not covered by the second photo resist block mask MB2. In this step, a hole KH0 is formed in the peripheral device region PB over the cobalt silicide region 30 on the left hand side of the gate stack GC5. Also, the anisotropic spacer etch step exposes the upper portions of the sacrificial polysilicon plugs OS1, OS2 as may be obtained from FIG. 1H.

Thereafter, the second photo resist block mask MB2 is removed and a spin-on glass layer 50 is spun on the remaining structure of FIG. 1A, as may be obtained from 1I.

It should be mentioned here that instead of the spin-on glass layer 50 an equivalent layer of low thermal budget could also be provided on the remaining structure of FIG. 1H.

In a next process step which is depicted in FIG. 1J, a chemical-mechanical polishing step is performed which backpolishes said spin-on glass layer 50 and exposes the upper portions of the sacrificial polysilicon plugs OS1, OS2 again.

In a subsequent process step which is shown In FIG. 1K, a polysilicon hard mask layer 55 is deposited over the resulting structure of FIG. 1J. Then, a carbon hard mask layer 56 is deposited on top of the polysilicon hard mask layer 56 and a resist layer 57 is deposited on top of the carbon hard mask layer 56. Subsequently, the photo resist layer 67 is structured by conventional lithography technique to have mask holes V1, V2, V3 corresponding to contacts holes to be formed later. Then, the carbon hard mask layer 56 is structured by using the patterned photo resist layer 57 which leads to the process state shown in FIG. 1K.

According to the illustration of FIG. 1L, the holes V1-V3 which have been transferred from the photo resist 57 to the carbon hard mask layer 56 are then transferred from the carbon hard mask layer 56 to the polysilicon layer 55.

Thereafter, the carbon hard mask layer 56 and the photo resist layer 57 are removed. Having regard to FIG. 1M, an oxide etch is performed which is selective to silicon nitride and cobalt silicide thus forming a first contact hole KH1 which exposes the cobalt silicide region 30 on the left hand of the gate stack GC5. On the other hand, the etch in the holes V2 and V3 only proceeds to the nitride strain layer 40 because of its selectivity.

Figure 1M:
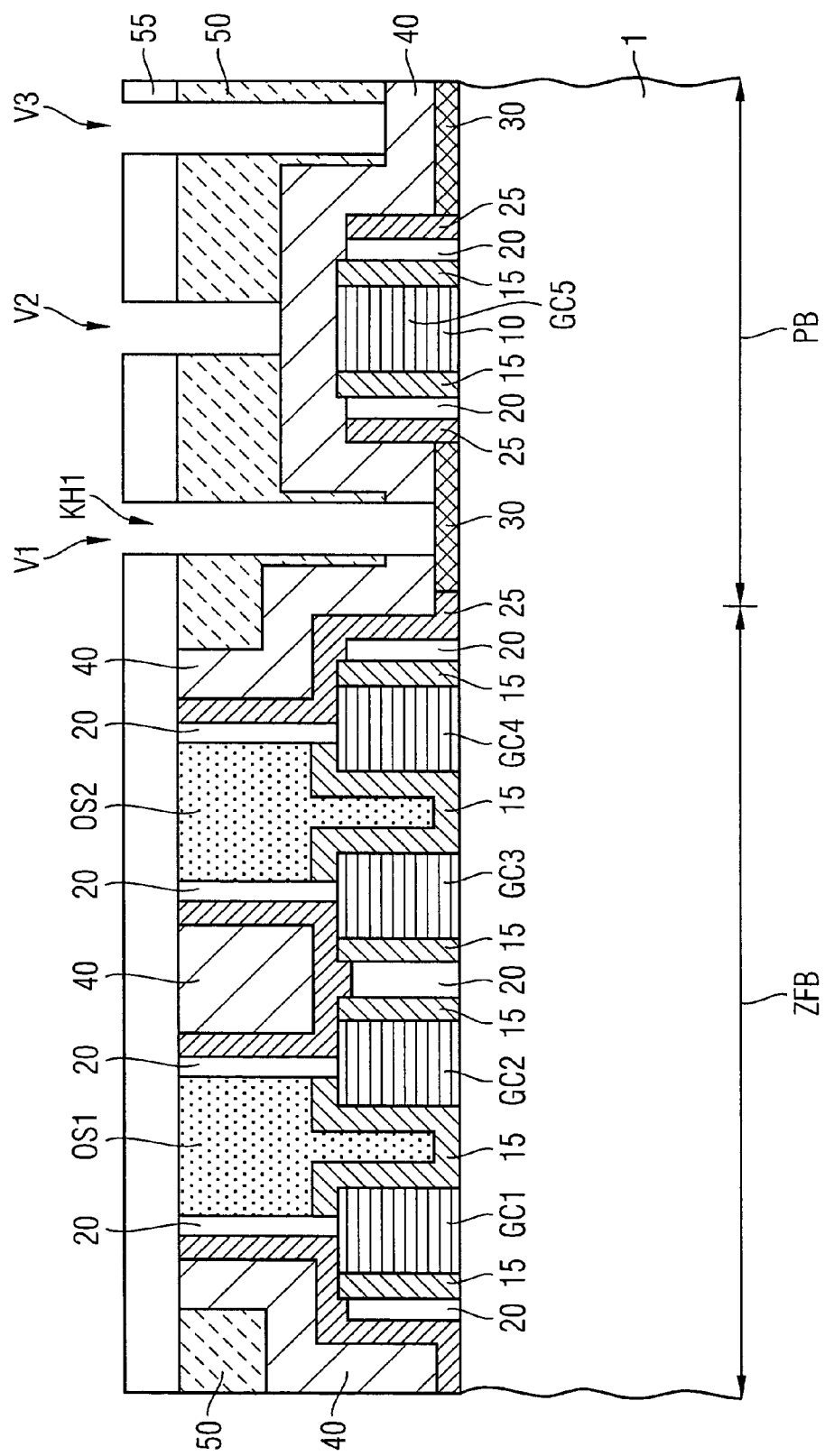

Thereafter, as shown in FIG. 1N, a photo resist mask layer 60 is deposited on the structure of FIG. 1M and patterned such that it fills and masks contact hole KH1, however, it is removed from openings V2, V3. Then, a nitride etch based on $CHF_3/CF_4$ chemistry is performed in order to form a second contact hole KH2 which exposes the silicide contact layer SC of gate stack GC5 (CMP FIG. 1A) and a third contact hole KH3 which exposes the cobalt silicide region 30 on the right hand side of the gate stack GC5. It should be noted here, that generally the contact holes KH1, KH2, KH3 is not in the same horizontal cross section and this is assumed here only for the sake of simplicity.

After the contact holes KH2, KH3 have been formed, the photo resist layer 60 is removed. Then, as shown in FIG. 1O, another thin oxide liner layer 65 is deposited over the structure of FIG. 1N after the removal of the photo resist layer 60. It should be noted here that this liner layer could also be a nitride layer. Then, an ARC layer 68 is deposited over the whole structure for filling the contact holes KH1, KH2, KH3. In a next step, the ARC layer 68 is etched back as to remain in the contact holes KH1. KH2, KH3 below the polysilicon hard mask layer 55. In a next step, the oxide liner layer 65 is also etched back below the surface of the polysilicon hard mask layer 55 which leads to the process stage shown in FIG. 1O.

Subsequently, as depicted in FIG. 1P, the ARC layer 68 is removed and thereafter, the polysilicon hard mask layer 55 and the sacrificial polysilicon plugs OS1, OS2 are removed in a single selective etch step.

With reference to FIG. 1Q, an oxide etch is performed using for example $C_4F_6$-chemistry, in order to open contact holes KH4, KH5 in the memory cell region ZFB where the sacrificial polysilicon plugs OS1, OS2 were located and in order to reopen contact holes KH1, KH2, KH3 in the peripheral device region PB. Next, cobalt silicide regions 70 are formed on the surface of the exposed semiconductor substrate 1 in the contact holes KH4, KH5 in order to improve the contact to the active areas (not shown) located in the semiconductor substrate 1. In this example, the cobalt silicide in the contact holes KH4, KH5 is CoSi formed at a temperature of approximately 550° C. Of course, in other examples, also $CoSi_2$ may be formed at 700° C., if the thermal budget of the structure is accordingly arranged.

With respect to FIG. 1R, a tungsten layer then deposited over the structure of FIG. 1Q and polished back by a chemical-mechanical polishing step in order to form contact plugs KS1-KS5 in contact holes K1-KH5.

In a next process step which is shown FIG. 1S, another tungsten layer is deposited over the structure of FIG. 1R and lithographically structured in order to form the wiring layer having wiring lines LB1-LB5 to electrically connect contact plugs KS1-KS6.

Finally, as shown in FIG. 1T, a second spin-on glass layer 70 is spun on the structure of FIG. 1S. Then, a layer of phosphor-silicate glass 80 is deposited on top of the second spin-on glass layer 70 and polished back in another chemical-mechanical polishing step.

Although the present invention has been described with reference to a preferred embodiment, it is not limited thereto, but can be modified in various manners which are obvious for a person skilled in the art. Thus, it is intended that the present invention is only limited by the scope of the claims attached herewith.

We claim as our invention:

1. A manufacturing method for an integrated semiconductor structure comprising the steps of:
   providing a semiconductor substrate having a plurality of gate stacks in a first region and at least one gate stack in a second region;
   forming a sacrificial plug made of a first material surrounded by an isolation layer between two adjacent gate stacks in the first region;
   depositing a planarization layer over said plurality of gate stacks in said first region and said at least one gate stack in said second region;
   backpolishing said planarization layer such that the upper surface of said sacrificial plug is exposed;
   forming a structured hardmask layer made of said first material on said backpolished planarization layer which structured hardmask layer adjoins said sacrificial plug and has at least one opening in said second region;
   forming at least one contact hole in said second region under said at least one opening in said second region, said at least one contact hole exposing a substrate contact area adjacent to said gate stack in said second region or a contact area in said gate stack;
   selectively removing said hardmask layer and said sacrificial plug in a single etch step, whereby another contact hole is formed between two adjacent gate stacks in said first region;
   removing said isolation layer on the bottom of said another contact hole such that the substrate is exposed; and
   filling said contact hole and said another contact hole with a respective contact plug.

2. The method according to claim 1, comprising the following steps before said step of selectively removing said hardmask layer and said sacrificial plug:
   performing a masked etch of said at least one contact hole;
   forming a liner in said contact holes and on said hardmask layer;

filling said contact holes with a sacrificial infill;

removing said liner from said hardmask layer to a level below the surface of the hardmask layer; and removing said sacrificial infill;

removing said liner layer on the bottom of contact holes together with said isolation layer on the bottom of contact holes.

3. The method according to claim 1, wherein before said step of depositing said planarization layer the following steps are performed:

performing deposition of a liner;

masking the first region;

exposing the substrate adjacent to said at least one gate stack in said second region; and forming said contact area by forming a metal silicide region on said substrate.

4. The method according to claim 2, wherein after said step of forming said contact area before said step of depositing said planarization layer the following steps are performed:

depositing a strain layer over said plurality of gate stacks in said first region and said at least one gate stack in said second region.

5. Method according to claim 4, were said strain layer is removed from said sacrificial plug and from at least a part of said contact area.

6. The method according to claim 1, wherein said first material is polysilicon or carbon.

7. The method according to claim 1, wherein the step of providing said contact area between said two adjacent gate stacks in said another contact hole comprises the steps of:

exposing the substrate; and forming said contact area by forming another metal silicide region on said substrate.

8. The method according to claim 1, wherein the first region is a memory cell region and the second region is a peripheral device region.

9. The method according to claim 1, wherein said planarization layer is a spin-on glass layer.

10. The method according to claim 1, wherein said sacrificial plug is surrounded by an isolation layer by depositing and anisotropic etching a first, second and third isolating liner layer.

11. The method according to claim 1, wherein a metal layer is deposited over the contact holes and polished back by a chemical-mechanical polishing step in order to form contact plugs in contact holes.

12. The method according to claim 11, wherein a wiring layer is deposited over said contact plugs and lithographically structured in order to form wiring lines to electrically connect contact plugs.

13. Method according to claim 1, wherein a metal layer is deposited over the contact holes and lithographically structured in order to form contact plugs and wiring lines.

14. The method according to claim 12 or 13, where a layer of phosphor-silicate-glass is deposited on top of the wiring lines.

15. Method according to claim 13, where a spin on dielectric is deposited between the wiring lines and the layer of phosphor-silicate-glass.

16. Method according to one of claims 11, 12 or 13, where the metal layer is made of tungsten.

* * * * *